United States Patent [19]
Takikawa

[11] Patent Number: 5,912,575
[45] Date of Patent: Jun. 15, 1999

[54] PHASE-LOCKED LOOP CIRCUIT WITH CHARGE PUMP AND TIME CONSTANT CIRCUIT

[75] Inventor: Yutaka Takikawa, Hyogo, Japan

[73] Assignees: Mitsubishi Electric Semiconductor Software Co., Ltd., Hyogo; Mitsubishi Denki Kabushiki Kaisha, Tokyo, both of Japan

[21] Appl. No.: 08/807,086

[22] Filed: Feb. 27, 1997

[30] Foreign Application Priority Data

Sep. 24, 1996 [JP] Japan ..................................... 8-251424

[51] Int. Cl.$^6$ ....................................... H03L 7/06
[52] U.S. Cl. .......................... 327/157; 327/156; 327/158; 331/8; 331/17; 331/25
[58] Field of Search ..................................... 327/156, 157, 327/158, 536, 537, 558, 543; 331/8, 17, 25

[56] References Cited

U.S. PATENT DOCUMENTS

| | | | |
|---|---|---|---|
| 4,698,531 | 10/1987 | Jones | 307/592 |
| 5,473,283 | 12/1995 | Luich | 331/8 |

FOREIGN PATENT DOCUMENTS

| | | |
|---|---|---|
| 0583586 | 2/1994 | European Pat. Off. . |
| 4216712 | 11/1993 | Germany . |
| 55-10238 | 1/1980 | Japan . |
| 63-90213 | 4/1988 | Japan . |
| 2113726 | 4/1990 | Japan . |
| 5276031 | 10/1993 | Japan . |
| 6268515 | 9/1994 | Japan . |
| 6284705 | 10/1994 | Japan . |
| 6291646 | 10/1994 | Japan . |

*Primary Examiner*—Kenneth B. Wells
*Assistant Examiner*—Minh Nguyen
*Attorney, Agent, or Firm*—Leydig, Voit & Mayer

[57] ABSTRACT

A phase-locked loop (PLL) circuit includes a low-pass filter, a voltage controlled oscillator that produces a PLL signal having a frequency that differs according to a control voltage supplied by the low-pass filter, a phase detector which receives the PLL signal and a reference signal and detects a phase difference between them to produce an error signal, and a charge pump that, in response to the error signal, supplies a charge to the low-pass filter or extracts a charge from the low-pass filter. The charge pump includes a variable resistance element the resistance of which varies when the error signal is applied, thereby nonlinearly adjusting the charge supplied to or extracted from the low-pass filter with respect to the duration of the error signal from the phase detector.

4 Claims, 4 Drawing Sheets

PHASE-LOCKED LOOP CIRCUIT WITH CHARGE PUMP AND TIME CONSTANT CIRCUIT

BACKGROUND OF THE INVENTION

1. Field of the Invention

The present invention relates to a phase-locked loop (PLL) circuit and, more particularly, to a charge pump disposed in the PLL circuit.

2. Description of the Prior Art

Referring now to FIG. 6, there is illustrated a block diagram of a PLL circuit. In the figure, reference numeral 12 denotes a phase detector (PD), 14 denotes a charge pump (CP), 16 denotes a low-pass filter (LPF), 18 denotes a voltage controlled oscillator (VCO), and 20 denotes a frequency divider. Furthermore, reference character fo denotes a reference signal, and f denotes a PLL signal having a frequency obtained by division of the frequency of the VCO 18 by the frequency divider 20, *UP denotes a negative logical error signal (although a negative logical signal is generally designated by reference character marked with a line directly over it, the negative logical error signal is designated by the reference character UP with * just before it) furnished by the phase detector 12, DOWN denotes an error signal furnished by the phase detector 12, and VCP denotes a VCO control voltage for controlling the VCO 18.

In operation, the phase detector 12 compares the phase of the PLL signal f with that of the reference signal fo. Then, the phase detector 12 furnishes either the error signal *UP or DOWN according to the phase difference between the PLL signal f and the reference signal fo. Either the error signal *UP or DOWN is furnished successively within a period of time during which there exists a phase difference between the PLL signal f and the reference signal fo. The pulse duration of the error signal is proportional to the phase difference.

The error signal *UP or DOWN furnished by the phase detector 12 is applied to the charge pump 14. The charge pump 14 furnishes the VCO control voltage VCP for controlling the oscillation frequency of the voltage controlled oscillator 18 according to the error signal *UP or DOWN in cooperation with the low-pass filter 16. More specifically, the charge pump 14 supplies a charge to the low-pass filter 16 or alternatively extracts a charge from the low-pass filter 16 according to the error signal *UP or DOWN so as to cause the low-pass filter 16 to generate the VCO control voltage VCP.

The voltage controlled oscillator 18 oscillates to furnish a signal having a frequency which differs according to the VCO control voltage VCP furnished by the low-pass filter 16. The frequency divider 20 receives the signal and divides its frequency by n to produce the PLL signal f applied to the phase detector 12. In the state in which the phase detector 12 does not furnish the error signals *UP and DOWN, the PLL circuit is locked and therefore the phase of the reference signal fo is exactly coincident with that of the PLL signal f.

Referring next to FIG. 7, there is illustrated a schematic circuit diagram of the prior art charge pump. In the figure, the low-pass filter 16 is also shown together with the charge pump 14 because the charge pump 14 and low-pass filter 16 produce the VCO control voltage VCP in cooperation with each other as previously explained. In FIG. 7, reference character $V_{DD}$ denotes a voltage of a power supply.

The charge pump 14 shown in FIG. 7 has a CMOS structure with a PMOS transistor P31 having a gate to which the error signal *UP is applied and an NMOS transistor N31 having a gate to which the error signal DOWN is applied.

The low-pass filter 16 has a passive structure comprised of two resistors R1 and R2 and two capacitors C1 and C2.

In operation, when the charge pump 14 receives the error signal *UP furnished by the phase detector 12, the PMOS transistor P31 is switched on. As a result, the power supply is electrically connected to ground and therefore the VCO control voltage VCP is generated and furnished from a point between the resistors R1 and R2 of the low-pass filter 16. The waveform of the VCO control voltage VCP is defined by the power supply voltage $V_{DD}$, ON resistance RP31 of the PMOS transistor P31, resistances of the resistors R1 and R2, and capacitances of the capacitors C1 and C2.

Referring next to FIG. 8, a graph shows an example of the waveform of the VCO control voltage VCP. When the error signal *UP is applied to the charge pump 14 at time $t_0$, the VCO control voltage VCP begins to rise. Then, when the error signal *UP disappears at the gate of the PMOS transistor P31, the VCO control voltage VCP begins to descend. As can be seen from the figure, even if an enough time has elapsed since time t1, the VCP does not return to its previous value that it had at time $t_0$ or an earlier time and has a voltage difference as shown in FIG. 8. This voltage difference controls the oscillation frequency of the voltage controlled oscillator 18.

Since the prior art PLL circuit is so constructed as mentioned above, it suffers the following disadvantage.

The performance of the PLL circuit can be evaluated with an eye to its locking speed and stability. The locking speed means the reciprocal of the time that elapses before the PLL is locked. The stability means the degree of resistance of the PLL to going out of the locking state caused by a disturbance such as noise. The locking speed is increased as the rate of change of the VCO control voltage VCP is increased. On the other hand, the stability is improved as the rate of change of the VCO control voltage VCP is decreased. That is, there is a trade-off relationship between the locking speed and the stability, with respect to the rate of change of the VCO control voltage VCP.

When the charge pump 14 shown in FIG. 7 receives the error signal *UP, it divides the power supply voltage $V_{DD}$ according to the phase difference, which is represented by the pulse duration of the error signal *UP, between the PLL signal f and the reference signal fo by means of the ON resistance RP31 of the PMOS transistor P3 and the resistors R1 and R2 so as to generate the VCO control voltage VCP. The capacitors C1 and C2 become charged by charges supplied by the power supply. Since the ON resistance RP31 of the PMOS transistor P31 is sufficiently small and the following inequalities

RP31<<R1, R2 hold, the VCO control voltage can be given by dividing the power supply voltage $V_{DD}$ using the resistors R1 and R2.

Accordingly, the variation of the VCO control voltage VCP is proportional to R2/(R1+R2). Since R2/(R1+R2)=1/(1+(R1/R2)), an increase in (R1/R2) reduces the rate of change of the VCO control voltage VCP and hence the stability is improved. On the contrary, a decrease in (R1/R2) increases the rate of change of the VCO control voltage VCP and hence the locking speed is increased. However, since the resistors R1 and R2 are passive elements, the ratio (R1/R2) in the prior art PLL circuit is set to a constant value. Therefore, the trade-off between the improvement of the locking speed and stability cannot be resolved.

As mentioned above, a problem with the prior art PLL circuit is that both of the locking speed and stability cannot be improved at the same time.

SUMMARY OF THE INVENTION

The object of the present invention is to overcome the above problem. More precisely, it is an object of the present invention to provide a PLL circuit with improved locking speed and stability of its locking state at the same time.

In accordance with the present invention, there is provided a phase-locked loop (PLL) circuit comprising: a low-pass filter; a voltage controlled oscillator which oscillates and furnishes a PLL signal having a frequency which differs according to a control voltage furnished by the low-pass filter; a phase detector which receives the PLL signal and a reference signal and detects a phase difference between them to furnish an error signal; a charge pump which in response to the error signal, supplies a charge to the low-pass filter or extracts a charge from the low-pass filter; and a control unit having a variable resistance element the resistance value of which varies during the error signal applied thereto is asserted, thereby nonlinearly adjusting the amount of the charge to be supplied or extracted to or from the low-pass filter by the charge pump with respect to the pulse duration of the error signal from the phase detector.

In accordance with a preferred embodiment of the present invention, the control unit comprises a time constant circuit, responsive to the error signal from the phase detector, for furnishing a voltage which decreases according to a time constant thereof, and a switching unit which is switched on in response to the error signal from the phase detector so as to connect one terminal thereof connected to a power supply with the low-pass filter, and which includes a first switching element disposed as the variable resistance element, having an ON resistance value which varies according to the voltage from the time constant circuit.

Preferably, the first switching element has one electrode connected to the power supply and a control electrode connected to the time constant circuit so as to receive the voltage from the time constant circuit, and the switching unit further includes a second switching element connected in series with the first switching element, and having one electrode connected to the low-pass filter and a control electrode to which the error signal is applied so that the second switching element is switched on. Furthermore, the control unit further includes a third switching element which is connected between the power supply and the time constant circuit and which remains in ON state at all times. In addition, the time constant circuit includes a capacitor having one end which is connected to the power supply by way of the third switching element and through which the varying voltage is supplied to the control electrode of the first switching element, and a fourth switching element which is connected in parallel with the capacitor and which is switched on in response to the error signal so that the voltage at the end of the capacitor begins to decrease according to the time constant of the time constant circuit.

Preferably, the threshold voltage of the first switching element can be higher than that of the third switching element.

The variable range of the ON resistance value of the first switching element can be determined by the capacitance of the capacitor and the ON resistance value of the fourth switching element.

Preferably, the ON resistance value of the second switching element can be so small that it can be ignored, as compared with the ON resistance value of the first switching element.

Further objects and advantages of the present invention will be apparent from the following description of the preferred embodiments of the invention as illustrated in the accompanying drawings.

DETAILED DESCRIPTION OF THE PREFERRED EMBODIMENT

Figure 1:
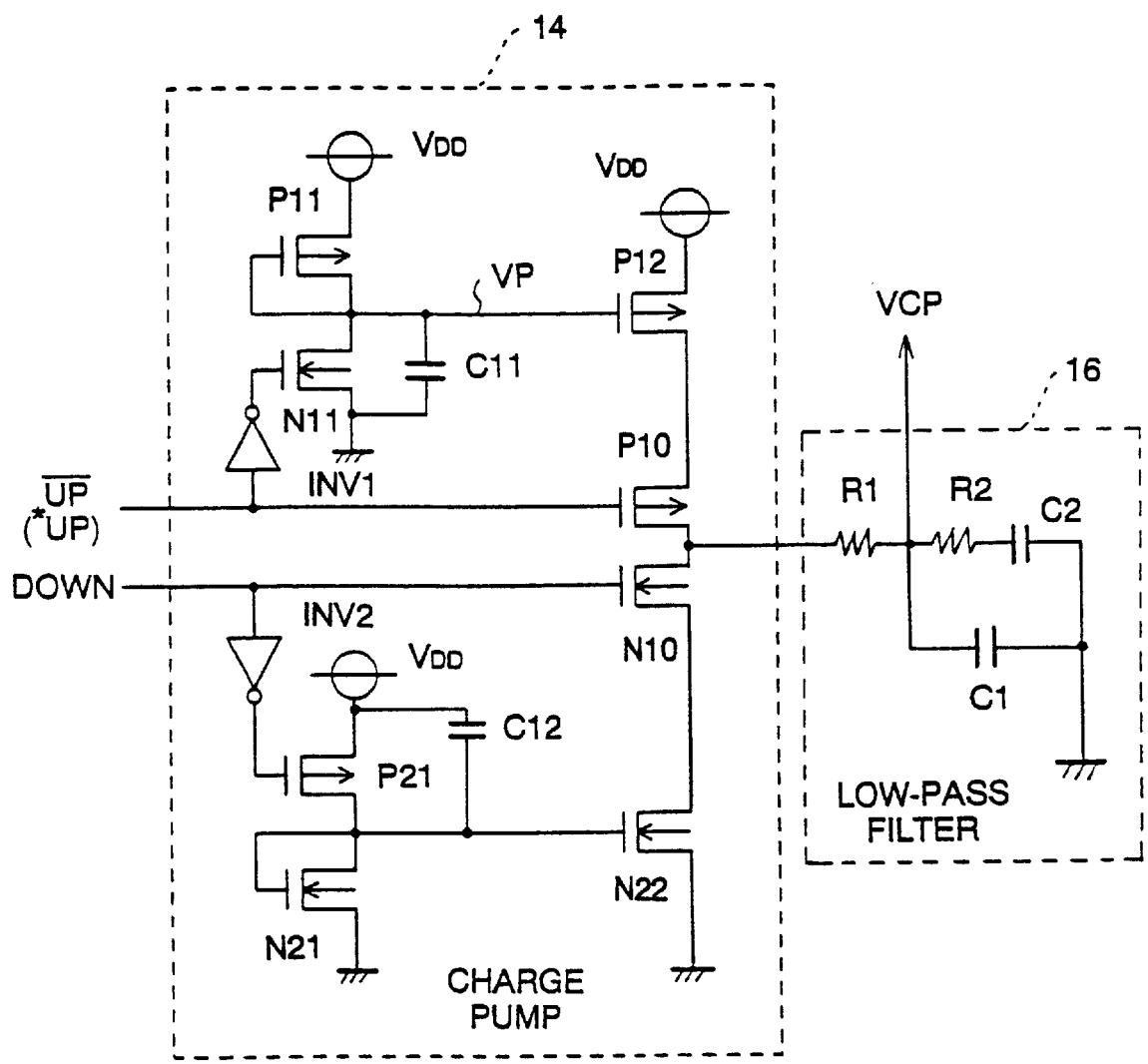
FIG. 1 is a schematic circuit diagram of a charge pump of a PLL circuit according to an embodiment of the present invention.
Figure 6:
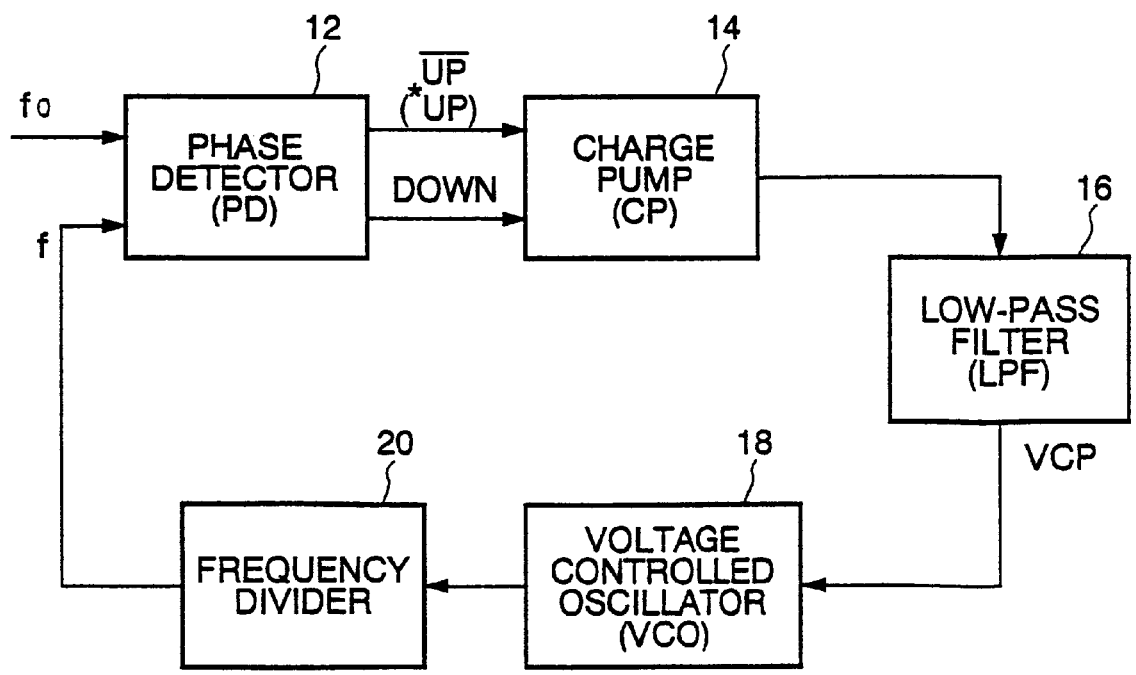
FIG. 6 is a block diagram of a PLL circuit.
Figure 7:
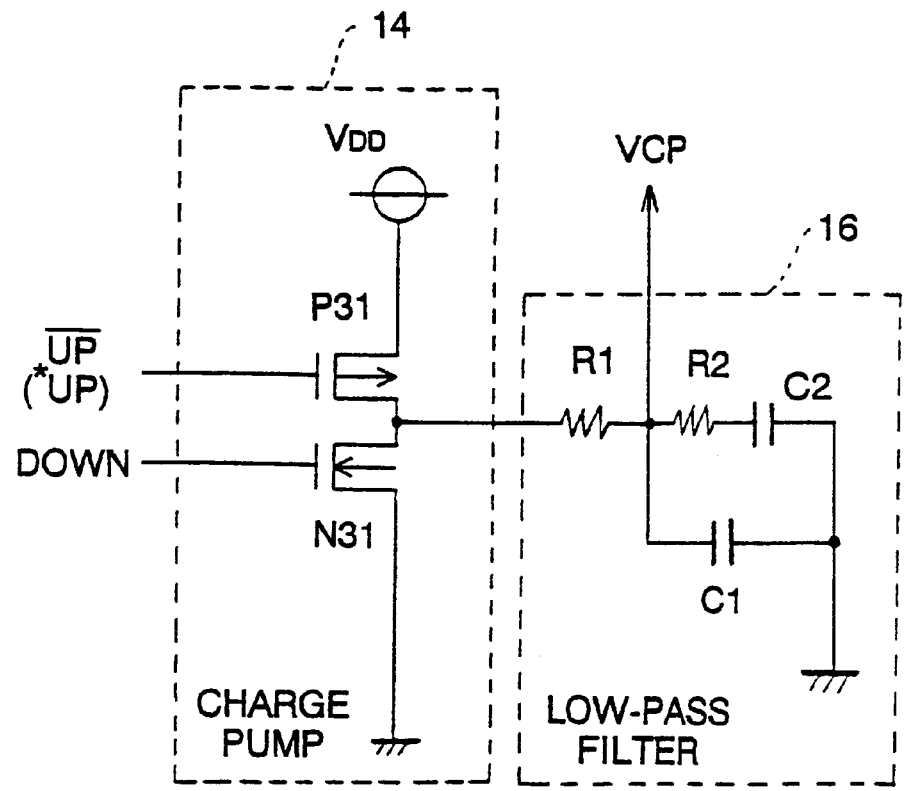
FIG. 7 is a schematic circuit diagram of a prior art charge pump.
Figure 8:
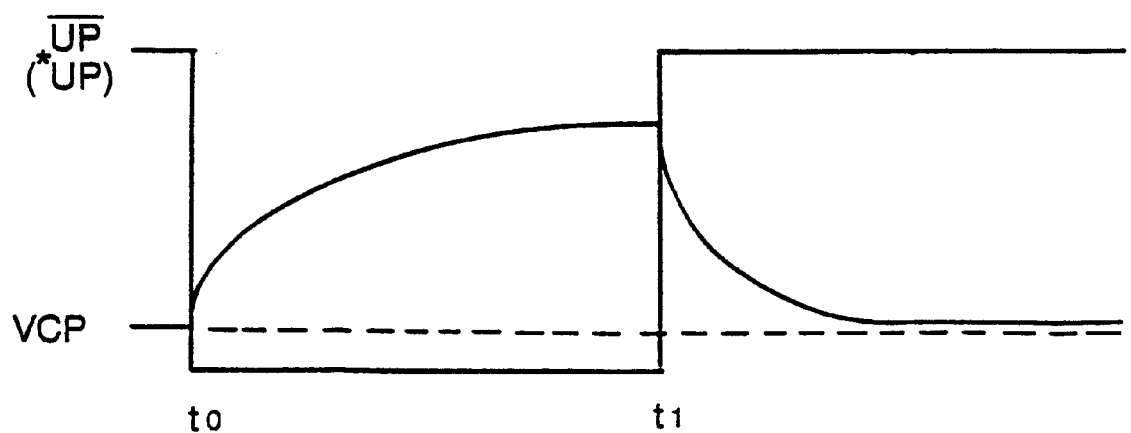
FIG. 8 is an example of the waveform of the VCO control voltage VCP which is controlled by the prior art charge pump shown in FIG. 7.

Referring next to FIG. 1, there is illustrated a schematic circuit diagram of a charge pump of a PLL circuit according to an embodiment of the present invention. In the figure, a low-pass filter 16 is also shown together with the charge pump 14 because the charge pump 14 and low-pass filter 16 produce the VCO control voltage VCP in cooperation with each other. The structure other than the charge pump 14 of the PLL circuit of the present invention is the same as that of the prior art PLL circuit shown in FIG. 6 and therefore the description of the structure will be omitted hereinafter.

The charge pump 14 is comprised of a pull-up section into which the error signal *UP furnished by the phase detector 12 is input and a pull-down section into which the error signal DOWN furnished by the phase detector 12 is input. The pull-up section of the charge pump 14 is provided with PMOS transistors P10, P11, and P12, an NMOS transistor N11, an inverter INV1, and a capacitor C11. The pull-down section of the charge pump 14 is provided with NMOS transistors N10, N21, and N22, a PMOS transistor P21, an inverter INV2, and a capacitor C12.

The PMOS transistor P10 and NMOS transistor N10 are a main part of the charge pump 14. Therefore, these two transistors will be referred to as charge pump main transistors hereinafter. Furthermore, the PMOS transistor P12 and NMOS transistor N22 control the charge pump main transistors P10 and N10. Therefore, these two transistors will be referred to as charge pump control transistors hereinafter.

The charge pump main transistors P10 and N10 only cause charges to pass therethrough. Components which control the amount of charges passing through the charge pump main transistors are the charge pump control transistors P12 and N22. Therefore, these transistors are chosen such that the driving capabilities of the charge pump control transistors P12 and N22 are higher than those of the charge pump main transistors P10 and N10. In other words, the ON resistance values of the charge pump main transistors P10 and N10 are so small that they can be ignored, as compared with those of the charge pump control transistors P12 and N22.

The low-pass filter 16 is comprised of two resistors R1 and R2 and two capacitors C1 and C2. The VCO control voltage VCP can be furnished from a point between the resistors R1 and R2.

When the PLL circuit remains in steady state, the PMOS transistor P11 remains in the conducting state since its gate is directly connected to its source. Therefore, since the capacitor C11 is connected to the power supply by way of the PMOS transistor P11, it has become pre-charged to "High" level. That is, the potential of the capacitor C11 designated by VP in FIG. 1 is kept high. As a result, the charge pump control transistor P12 changes to quasi-ON state in which the threshold voltage $V_{TH(P11)}$ of the PMOS transistor P11 is applied to the gate of the charge pump control transistor P12, not fully ON state. To this end, the threshold voltage $V_{TH(P12)}$ of the PMOS transistor P12 is set to be higher than the threshold voltage $V_{TH(P11)}$ of the PMOS transistor P11.

When the charge pump 14 receives the error signal *UP, the charge pump main transistor P10 is switched on while the NMOS transistor N11 is switched on. As a result, the electric charge pre-charged in the capacitor C11 is discharged by way of the NMOS transistor N11 and therefore the potential VP decreases according to the time constant (RN11.C11) defined by the ON resistance RN11 of the NMOS transistor N11 and the capacitance C11. As the potential VP is reduced, the charge pump control transistor P12 changes from the quasi-ON state to the fully ON state and then to the saturated state. That is, the ON resistance RP12 of the charge pump control transistor P12 varies nonlinearly with a reduction of the potential VP.

Since the reduction of the potential VP thus varies the ON resistance of the charge pump control transistor P12, the amount of charge supplied to the low-pass filter 16 by way of the charge pump main transistor P10 varies according to the pulse duration of the error signal, too. The time constant (RN11.C11) can be set to a desired value by choosing the capacitance of the capacitor C11 and the ON resistance of the NMOS transistor N11.

The VCO control voltage VCP is generated by dividing the power supply voltage $V_{DD}$ by means of the ON resistance RP12 of the charge pump control transistor P12, ON resistance RP10 of the charge pump main transistor P10, and resistors R1 and R2. In the case where the charge pump main transistor P10 remains in the conducting state, the following inequalities hold.

RP10<<RP12, R1, R2

Accordingly, the ON resistance RP10 of the charge pump control transistor P10 can be neglected with respect to the other resistor values. Thus, the VCO control voltage VCP is proportional to R2/(RP12+R1+R2)=1/(1+(RP12+R1)/R2).

As previously explained, as the ON resistance of the charge pump control transistor P12 varies nonlinearly with the reduction of the potential VP, the VCO control voltage VCP varies nonlinearly with the reduction of the potential VP and then reaches a saturated value.

The period of time during which the potential VP is decreasing proportional to the pulse duration of the error signal *UP. Furthermore, when the PLL circuit goes out of the locking state, the phase detector furnishes the error signal *UP to the charge pump 14 having a pulse duration which increases with an increase in the degree of deviation from the locking state (i.e., the phase difference between the PLL signal f and the reference signal fo). Accordingly, as the pulse duration of the error signal *UP becomes wider, the VCO control voltage VCP rises to a higher voltage when the error signal *UP is asserted.

Figure 2:
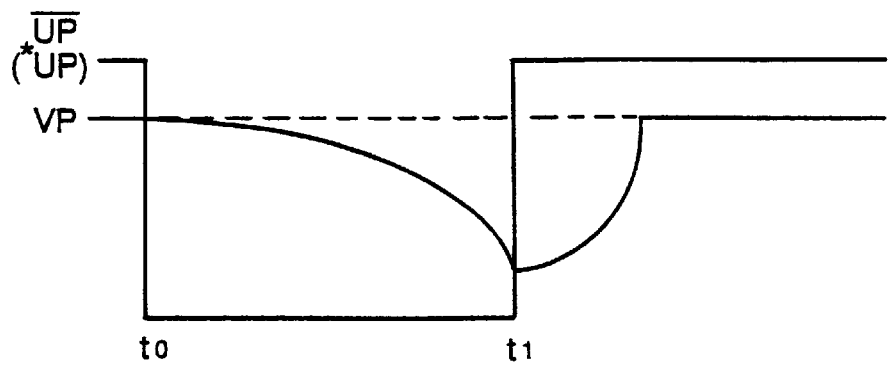
FIG. 2 is an example of the waveform of a potential at one terminal of a time constant circuit of the charge pump shown in FIG. 1 when the pulse duration of an error signal *UP is wide.
Figure 3:
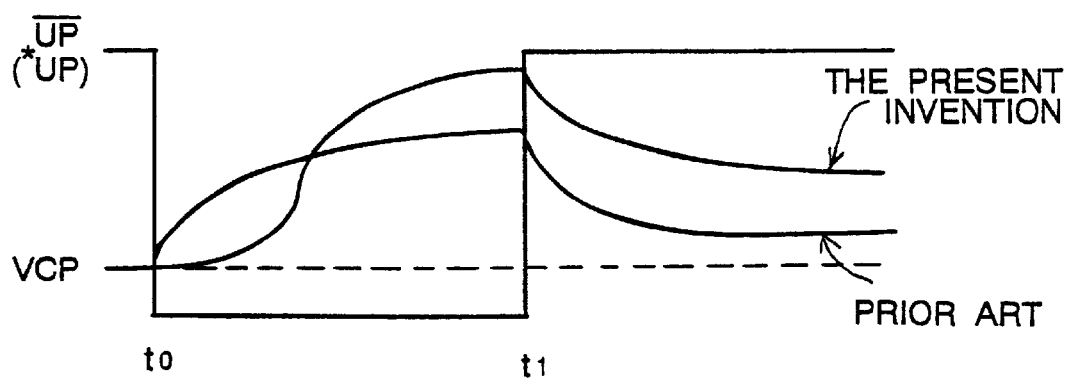
FIG. 3 is an example of the waveform of a VCO control voltage VCP furnished by a low-pass filter shown in FIG. 1 when the pulse duration of the error signal *UP is wide.
Figure 4:
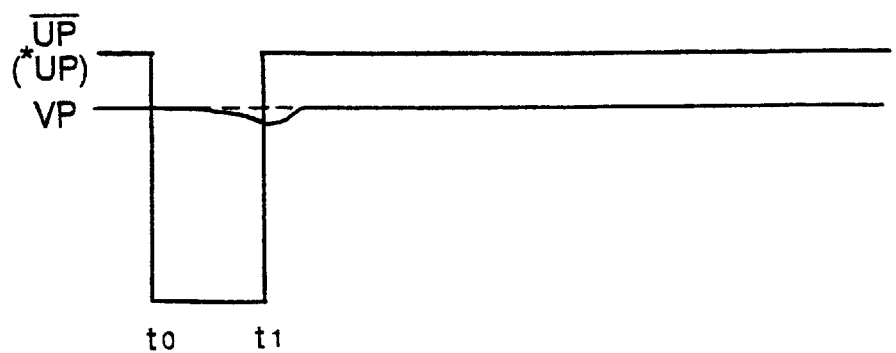
FIG. 4 is an example of the waveform of a potential at one terminal of a time constant circuit of the charge pump shown in FIG. 1 when the pulse duration of the error signal *UP is narrow.
Figure 5:
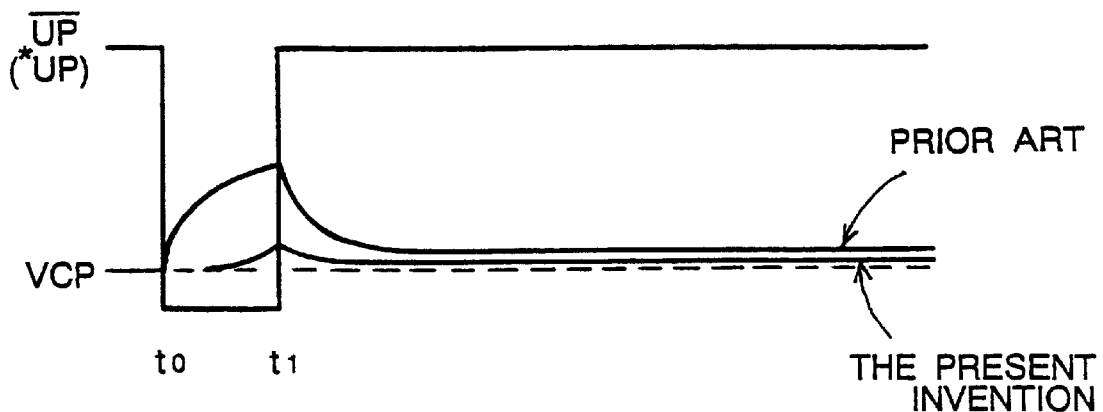
FIG. 5 is an example of the waveform of a VCO control voltage VCP furnished by a low-pass filter shown in FIG. 1 when the pulse duration of the error signal *UP is narrow.

Referring next to FIGS. 2 and 3, there are illustrated examples of the waveforms of the potential VP and VCO control voltage VCP when the pulse duration of the error signal *UP is wide, respectively. Furthermore, FIGS. 4 and 5 show examples of the waveforms of the potential VP and VCO control voltage VCP when the pulse duration of the error signal *UP is narrow, respectively. In FIGS. 3 and 5, the waveform of the VCO control voltage VCP of the prior art PLL circuit is also shown for comparison with that of the PLL circuit according to the present invention.

First, a description will be given of the case where the pulse duration of the error signal *UP applied to the charge pump 14 is wide with reference to FIGS. 1, 2, and 3.

As shown in FIG. 2, when the error signal *UP is applied to the charge pump 14 at time $t_0$, the potential VP which has remained in a steady state decreases according to the time constant (RN11.C11) defined by the ON resistance RN11 of the NMOS transistor N11 and the capacitance C11. When the error signal *UP makes a LOW to HIGH transition at time $t_1$, the potential VP returns to the steady state by virtue of the pre-charge supplied via the PMOS transistor P11.

On the other hand, when the error signal *UP is applied to the charge pump at time $t_0$, the VCO control voltage VCP furnished by the low-pass filter 16 increases gradually since the charge pump control transistor P12 remains in the quasi-ON state, as shown in FIG. 3. After that, when the potential VP reaches the threshold voltage $V_{TH(P12)}$, the charge pump control transistor P12 changes to the fully ON state and then its resistance RP12 decreases abruptly with the result that the VCO control voltage VCP decreases and the potential VP increases abruptly. Then, as the potential VP further increases, the VCO control voltage VCP increases gradually and finally becomes saturated. This trend of the VCO control voltage VCP is caused by the characteristic of the charge pump of this embodiment. Although the VCO control voltage VCP decreases when the error signal *UP makes a LOW to HIGH transition at time $t_1$, the VCO control voltage VCP remains high as compared with the prior art PLL circuit even after enough time has elapsed since time t1 because the VCO control voltage VCP at time t1 is higher than that in the prior art PLL circuit. The high VCO control voltage VCP increases the locking speed of the PLL circuit.

Next, a description will be given the case where the pulse duration of the error signal *UP applied to the charge pump 14 is narrow, with reference to FIGS. 1, 4, and 5.

As shown in FIG. 4, when the error signal *UP is applied to the charge pump 14 at time $t_0$, the potential VP which has remained in a steady state decreases according to the time constant (RN11.C11) defined by the ON resistance RN11 of the NMOS transistor N11 and capacitance C11. When the error signal *UP makes a LOW to HIGH transition at time $t_1$, the potential VP returns to the steady state by virtue of the pre-charge via the PMOS transistor P11.

On the other hand, when the error signal *UP is applied to the charge pump at time $t_0$, the VCO control voltage VCP furnished by the low-pass filter 16 increases gradually since the charge pump control transistor P12 remains in the quasi-ON state, as shown in FIG. 5. This trend of the VCO control voltage VCP is caused by the output impedance characteristic of the charge pump of this embodiment. Although the VCO control voltage VCP decreases when the error signal *UP makes a LOW to HIGH transition at time $t_1$, the VCO control voltage VCP remains low as compared with the prior art PLL circuit even after an enough time has elapsed since time $t_1$ because the VCO control voltage VCP at time $t_1$ is lower than that in the prior art PLL circuit. The low VCO control voltage VCP improves the stability of the PLL circuit.

In the foregoing description, the case where the error signal *UP is applied to the charge pump 14 is explained as an example. In the case where the error signal DOWN is applied to the charge pump 14, the operating mechanism is the same as that described, except that the polarity of the error signal, potential VP, and VCO control voltage VCP are reversed. For example, while the VCO control voltage VCP remains high in its steady state, it decreases according to the output impedance characteristic of the charge pump 14 when the error signal DOWN is applied to the charge pump 14. Furthermore, the time constant is given by (RN21.C12) and can be set to a desired value by choosing the capacitance of the C12 and ON resistance of the NMOS transistor N21.

Thus, the PLL circuit according to the embodiment makes it possible to change the capability of the charge pump according to the pulse duration of the error signal. Therefore, the embodiment can increase the locking speed of the PLL circuit and simultaneously improve the stability of the locked state.

As previously explained, the PLL circuit according to the present invention comprises a low-pass filter, a voltage controlled oscillator which oscillates and furnishes a PLL signal having a frequency which differs according to a control voltage furnished by the low-pass filter, a phase detector which receives the PLL signal and a reference signal and detects a phase difference between them to furnish an error signal, and a charge pump which, in response to the error signal, supplies a charge to the low-pass filter or extracts a charge from the low-pass filter. Furthermore, the charge pump includes a variable resistance element the resistance of which varies while the error signal applied thereto is asserted, thereby nonlinearly adjusting the amount of the charge to be supplied to or extracted from the low-pass filter with respect to the pulse duration of the error signal from the phase detector. Therefore, since the PLL circuit according to the present invention can vary the capability of the charge pump according to the pulse duration of the error signal, the present invention offers the advantage of being able to increase the locking speed of the PLL circuit and simultaneously improve the stability of the locked state.

Furthermore, the charge pump includes a time constant circuit, responsive to the error signal from the phase detector, for furnishing a voltage which decreases according to a time constant thereof, and a switch which is switched on in response to the error signal from the phase detector so as to connect one terminal thereof connected to a power supply with the low-pass filter, and which includes a first switching element, e.g., a PMOS or NMOS transistor as the variable resistance element, having a resistance which varies according to the voltage from the time constant circuit. Therefore, the whole of the PLL circuit can built in one integrated circuit.

The first switching element has one electrode connected to the power supply and a control electrode connected to the time constant circuit to receive the voltage from the time constant circuit, and the switch further includes a second switching element, e.g., a PMOS or NMOS transistor, connected in series with the first switching element, and having one electrode connected to the low-pass filter and a control electrode to which the error signal is applied so that the second switching element is switched on. Furthermore, the charge pump includes a third switching element, e.g., a PMOS or NMOS transistor which is connected between the power supply and the time constant circuit and which remains in the ON state at all times, and the time constant unit includes a capacitor having an end which is connected to the power supply by way of the third switching element and through which the varying voltage is applied to the control electrode of the first switching element, and a fourth switching element, an NMOS or PMOS transistor, which is connected in parallel with the capacitor and which is switched on in response to the error signal so that the voltage at the end of the capacitor begins to decrease according to the time constant of the time constant unit. Thus, the present invention can provide a PLL circuit having a simplified structure and capable of increasing its locking speed and simultaneously improving the stability of the locked state.

Furthermore, the threshold voltage of the first switching element is higher than that of the third switching element. Accordingly, the ON resistance of the first switching element can be varied smoothly.

In addition, the variable range of the resistance of the first switching element can be determined by the capacitance of the capacitor and the ON resistance of the fourth switching element. Accordingly, the variable range of the first switching element can be predetermined by setting the time constant of the time constant circuit to a desired value.

Furthermore, the ON resistance of the second switching element is so small that it can be ignored, as compared with the ON resistance of the first switching element. The size of the second switching element which only serves as a path through which the charge to be supplied to or extracted from the low-pass filter can be reduced, and therefore the space occupied by the charge pump can be reduced.

Many widely different embodiments of the present invention may be constructed without departing from the spirit and scope of the present invention. It should be understood that the present invention is not limited to the specific embodiments described in the specification, except as defined in the appended claims.

What is claimed is:

1. A phase-locked loop (PLL) circuit comprising:

a low-pass filter;

a voltage controlled oscillator which oscillates and produces a PLL signal having a frequency which varies according to a control voltage supplied by the low-pass filter;

a phase detector which receives the PLL signal and a reference signal and detects a phase difference between the PLL and reference signals and, in response, produces an error signal;

a charge pump which, in response to the error signal, supplies a charge to said low-pass filter or extracts a charge from said low-pass filter; and control means receiving the error signal and having a variable resistance element, the resistance of which varies when the error signal is applied, thereby nonlinearly adjusting the charge supplied to or extracted from said low-pass filter by said charge pump in response to the duration of the error signal, said control means comprising:

a time constant circuit, responsive to the error signal, producing a voltage decreasing according to a time constant of said time constant circuit;

switching means closed in response to the error signal to connect a power supply to said low-pass filter, said variable resistance element including a first switching element having one electrode connected to the power supply, a control electrode connected to said time constant circuit to receive the voltage produced by said time constant circuit, and an ON resistance varying according to the voltage produced by said time constant circuit, said switching means including a second switching element connected in series with said first switching element and having one electrode connected to said low-pass filter and a control electrode to which the error signal is applied for switching ON said second switching element; and a third switching element connected between the power supply and said time constant circuit and remaining ON at all times, said time constant circuit further including a capacitor having one end connected to the power supply through said third switching element and through which a varying voltage is supplied to the control electrode of said switching element; and a fourth switching element connected in parallel with said capacitor and switched ON in response to the error signal so that the voltage at the end of said capacitor begins to decrease according to the time constant of said time constant circuit.

2. The PLL circuit according to claim 1, wherein a threshold voltage of said first switching element is higher than a threshold voltage of said third switching element.

3. The PLL circuit according to claim 1, wherein a variable range of the ON resistance of said first switching element is determined by the capacitance of said capacitor and the ON resistance of said fourth switching element.

4. The PLL circuit according to claim 1, wherein the ON resistance of said second switching element is insignificant compared with the ON resistance of said first switching element.

* * * * *